United States Patent
Lee

(10) Patent No.: US 11,906,591 B2
(45) Date of Patent: Feb. 20, 2024

(54) INSULATION RESISTANCE MEASUREMENT APPARATUS AND METHOD THEREOF

(71) Applicant: LG Energy Solution, Ltd., Seoul (KR)

(72) Inventor: Sung Gun Lee, Daejeon (KR)

(73) Assignee: LG Energy Solution, Ltd. (KR)

( * ) Notice: Subject to any disclaimer, the term of this patent is extended or adjusted under 35 U.S.C. 154(b) by 303 days.

(21) Appl. No.: 17/293,589

(22) PCT Filed: Dec. 18, 2019

(86) PCT No.: PCT/KR2019/018052
§ 371 (c)(1),
(2) Date: May 13, 2021

(87) PCT Pub. No.: WO2020/141768
PCT Pub. Date: Jul. 9, 2020

(65) Prior Publication Data
US 2022/0003823 A1  Jan. 6, 2022

(30) Foreign Application Priority Data
Jan. 3, 2019  (KR) .................... 10-2019-0000520

(51) Int. Cl.
*G01R 31/38*  (2006.01)
*G01R 31/3842*  (2019.01)
(Continued)

(52) U.S. Cl.
CPC ......... *G01R 31/3842* (2019.01); *G01R 27/14* (2013.01); *G01R 31/3646* (2019.01); *G01R 31/3648* (2013.01); *H01M 10/48* (2013.01)

(58) Field of Classification Search
CPC ............ G01R 31/3842; G01R 31/3646; G01R 31/3648; G01R 31/36; G01R 31/52;
(Continued)

(56) References Cited

U.S. PATENT DOCUMENTS

2014/0095093 A1  4/2014 Hong et al.
2015/0291041 A1  10/2015 Higuchi et al.
(Continued)

FOREIGN PATENT DOCUMENTS

CN  103033729 A  4/2013
CN  103869179 A  6/2014
(Continued)

OTHER PUBLICATIONS

E. L. Brancato et al. "Measurement of Insulation Resistance on Energized Systems", IEEE, the AIEE Middle Eastern District Meeting, Baltimore, MD, Oct. 3-5, 1950 (Year: 1951).*
(Continued)

*Primary Examiner* — Catherine T. Rastovski
*Assistant Examiner* — Lal C Mang
(74) *Attorney, Agent, or Firm* — Lerner David LLP

(57) ABSTRACT

An insulation resistance measurement apparatus includes a first resistance unit having one end connected to an anode of a battery and the other end connected ground, and variably having a first resistance value or a second resistance value greater than the first resistance value; a second resistance unit having one end connected to a cathode of the battery and the other end connected to ground, and variably having a third resistance value or a fourth resistance value greater than the third resistance value; a voltage measurement unit configured to measure a voltage across the first or second resistance unit; and an insulation resistance calculation unit configured to calculate a first insulation resistance value between the anode of the battery and ground and a second insulation resistance value between the cathode of the battery and ground by using the first to fourth resistance values and the measured voltage.

15 Claims, 11 Drawing Sheets

(51) Int. Cl.
*G01R 31/36* (2020.01)
*G01R 27/14* (2006.01)
*H01M 10/48* (2006.01)

(58) Field of Classification Search
CPC .............. G01R 31/389; G01R 31/3835; G01R 31/385; G01R 27/14; G01R 27/18; G01R 27/025; H01M 10/48; H01M 10/425; H01M 2010/4271; Y02E 60/10
See application file for complete search history.

(56) References Cited

U.S. PATENT DOCUMENTS

| | | | |
|---|---|---|---|
| 2017/0016951 | A1 | 1/2017 | Sung et al. |
| 2018/0029490 | A1 | 2/2018 | Fritz et al. |
| 2018/0074113 | A1 | 3/2018 | Sung et al. |
| 2019/0011504 | A1 | 1/2019 | Kim et al. |
| 2019/0234997 | A1 * | 8/2019 | Dan ................ B60L 50/60 |
| 2020/0088803 | A1 | 3/2020 | Park et al. |

FOREIGN PATENT DOCUMENTS

| | | | |
|---|---|---|---|
| CN | 206155187 U | | 5/2017 |
| CN | 108303588 A | * | 7/2018 |
| CN | 108303588 A | | 7/2018 |
| CN | 108445296 A | * | 8/2018 |
| CN | 108445296 A | | 8/2018 |
| CN | 208239521 U | | 12/2018 |
| JP | 2006220520 A | * | 8/2006 |
| JP | 2006220520 A | | 8/2006 |
| JP | 2007147391 A | * | 6/2007 |
| JP | 2010019603 A | | 1/2010 |
| JP | 2013099087 A | | 5/2013 |
| JP | 2016211978 A | | 12/2016 |
| JP | 2017530333 A | | 10/2017 |
| JP | 2019512679 A | | 5/2019 |
| KR | 20100048060 A | | 5/2010 |
| KR | 20130109066 A | | 10/2013 |
| KR | 101512395 B1 | | 4/2015 |
| KR | 20150081988 A | | 7/2015 |
| KR | 101610921 B1 | | 4/2016 |
| KR | 20180012683 A | | 2/2018 |
| KR | 101936220 B1 | | 1/2019 |
| WO | 2018093045 A1 | | 5/2018 |
| WO | 2019004544 A1 | | 1/2019 |

OTHER PUBLICATIONS

International Search Report for Application No. PCT/KR2019/018052, dated Apr. 3, 2020, 3 pages.

Search Report for European Application No. 19907369.3 dated Jan. 25, 2022. 9 pgs.

* cited by examiner (a)

(b)

(a)

(b)

|  | $R_P$ (kohm) | | | | |
|---|---|---|---|---|---|
|  | 100 | 1000 | 10000 | 30000 | 50000 |
| $R_N$ (kohm) 100 | 22.6% | 9.5% | 8.0% | 8.2% | 8.2% |
| 1000 | 17.6% | 4.8% | 4.0% | 3.8% | 4.1% |
| 10000 | 16.8% | 5.0% | 9.1% | 12.5% | 14.0% |
| 30000 | 17.2% | 5.6% | 12.4% | 12.4% | 13.6% |
| 50000 | 16.6% | 5.2% | 13.6% | 30.8% | 43.4% |

(a)

|  | $R_P$ (kohm) | | | | |
|---|---|---|---|---|---|
|  | 100 | 1000 | 10000 | 30000 | 50000 |
| $R_N$ (kohm) 100 | 72.7% | 28.0% | 23.2% | 22.7% | 23.1% |
| 1000 | 54.2% | 9.7% | 5.3% | 5.0% | 4.9% |
| 10000 | 52.7% | 8.3% | 5.8% | 6.9% | 7.5% |
| 30000 | 52.0% | 8.9% | 7.5% | 11.2% | 7.1% |
| 50000 | 51.8% | 8.5% | 7.7% | 13.6% | 16.6% |

INSULATION RESISTANCE MEASUREMENT APPARATUS AND METHOD THEREOF

CROSS-REFERENCE TO RELATED APPLICATIONS

The present application is a national phase entry under 35 U.S.C. § 371 of International Application No. PCT/KR2019/018052 filed Dec. 18, 2019, published in Korean, which claims priority Korean Patent Application No. 10-2019-0000520, filed on Jan. 3, 2019, all of which are incorporated herein by reference.

TECHNICAL FIELD

The present invention relates to an apparatus and a method for measuring an insulation resistance of a battery.

BACKGROUND ART

In high voltage battery systems, a certain level of insulation must be maintained at all times to protect users from the risk of short circuits. Accordingly, more accurate insulation resistance measurement is required when a battery system is diagnosed.

In the conventional insulation resistance measurement, the distribution resistor is alternately connected to either of the battery cathode and anode with reference to the ground (e.g., chassis), and the insulation resistance value was calculated from the measured distribution voltage value.

However, conventionally, since the measurement range within the allowable error range is limited based on-a designed distribution resistance value, for example, as in the case where the actual insulation resistance value is greater than the sum of pre-designed distribution resistance values at the measurement terminals of the battery's cathode or anode, the calculated insulation resistance value is out of the measurement range within the error range, so that there was a problem of low measurement accuracy.

SUMMARY

Technical Problem

The present invention has been made to solve the above problems, and an object of the present invention is to provide an insulation resistance measuring apparatus and method which can prevent the measurement accuracy from being lowered by calculating the insulation resistance in a measurement range within an error range corresponding to an actual insulation resistance value when measuring an insulation resistance of a battery.

Technical Solution

An insulation resistance measurement apparatus according to an embodiment of the present invention includes: a first resistance unit having a first end connected to a cathode of a battery and a second end connected to a ground, wherein the first resistance unit is variably controllable between having a first resistance value or a second resistance value greater than the first resistance value; a second resistance unit having a first end connected to an anode of the battery and a second end connected to the ground, wherein the second resistance unit is variably controllable between having a third resistance value or a fourth resistance value greater than the third resistance value; a voltage measurement unit configured to measure a voltage either or both the first resistance unit or the second resistance unit; and an insulation resistance calculation unit configured to calculate a first insulation resistance value between the cathode of the battery and the ground and a second insulation resistance value between the anode of the battery and the ground based on the first resistance value, the second resistance value, the third resistance value, the fourth resistance value and the voltage measured by the voltage measurement unit.

In addition, the insulation resistance measurement apparatus according to an embodiment of the present invention further includes a voltage distribution unit connected in parallel with the first resistance unit or the second resistance unit, wherein the voltage distribution unit includes a plurality of resistors connected in series. In this case, the voltage measured by the voltage distribution unit may be a voltage measured across some of the plurality of resistors of the voltage distribution unit.

The insulation resistance calculation unit has a first insulation resistance measurement mode and a second insulation resistance measurement mode, wherein the first insulation resistance measurement mode has a lower error rate than the second insulation resistance measurement mode in a first measurement range, and wherein the second insulation resistance measurement mode has a lower error rate than the first insulation resistance measurement mode in a second measurement range, and is configured to calculate the first and second insulation resistance values based on the first resistance value and the third resistance value in the first insulation resistance measurement mode, and calculate the first and second insulation resistance values based on the second resistance value and the fourth resistance value in the second insulation resistance measurement mode.

For example, for the first insulation resistance value, the insulation resistance calculation unit may determine whether the first insulation resistance value is within the first or second measurement range; and calculate a first actual insulation resistance value in whichever measurement mode has the lower error rate in the determined first or second measurement range that the first insulation resistance value is within, and for the second insulation resistance value, the insulation resistance calculation unit may determine whether the second insulation resistance value is within the first or second measurement range; and calculate a second actual insulation resistance value in whichever measurement mode has the lower error rate in the determined first or second measurement range that the second insulation resistance value is within.

In some examples, the first resistance unit may include a first resistance value unit that is ON/OFF controlled by a first switch and a second resistance value unit that is ON/OFF controlled by a second switch, wherein the first and second resistance value units are connected in parallel between the cathode of the battery and the ground. The second resistance unit may include a third resistance value unit that is ON/OFF controlled by a third switch and a fourth resistance value unit that is ON/OFF controlled by a fourth switch, wherein the third and fourth resistance value units are connected in parallel between the anode of the battery and the ground.

In some examples, the first resistance unit may include a first variable resistance unit that is changeable between the first resistance value and the second resistance value based on ON/OFF control by a first switch, wherein the first variable resistance unit is between the cathode of the battery and the ground. The second resistance unit may include a second variable resistance unit that is changeable between the third resistance value and the fourth resistance value based on ON/OFF control by a second switch, wherein the second variable resistance unit is between the anode of the battery and the ground.

In some examples, a switching unit may be configured to, when the first switch or the second switch of the first resistance unit is ON, control the third switch and the fourth switch of the second resistance unit to be OFF. In some examples, a switching unit may be configured to, when the third switch or the fourth switch of the second resistance unit is ON, control the first switch and the second switch of the first resistance unit to be OFF.

In the first insulation resistance measurement mode, the insulation resistance calculation unit is configured to calculate the first and second insulation resistance values based on the voltage measured across some of the plurality resistors of the voltage distribution unit when the first switch is ON and the second, third and fourth switches are OFF and the voltage measured across some of the plurality of resistors of the voltage distribution unit when the third switch is ON and the first, second and fourth switches are OFF.

In addition, in the second insulation resistance measurement mode, the insulation resistance calculation unit is configured to calculate the first and second insulation resistance values based on the voltage measured across some of the plurality of resistors of the voltage distribution unit when the second switch is ON and the first, third, and fourth switches are OFF and the voltage measured across some of the plurality of resistors of the voltage distribution unit when the fourth switch is ON and the first, second and third switches are OFF.

For example, the first, second, third and fourth resistance values vary according to the battery or according to a device in which the battery is mounted.

The voltage distribution unit further includes a fifth switch connected in series with the plurality of resistors and configured to be ON/OFF controlled.

As one embodiment, the battery is a battery rack, and the ground is a chassis of the battery rack.

Meanwhile, an insulation resistance measurement method according to an embodiment of the present invention and performed using one of a plurality of given insulation resistance measurement modes, wherein each respective insulation resistance measurement mode corresponds to a respective measurement range for which an insulation resistance measurement error rate within a respective measurement range is lower than insulation resistance measurement error rates for other ones of the plurality of insulation resistance measurement modes within the respective measurement range includes: calculating a first insulation resistance value between a cathode of the battery and a ground and a second insulation resistance value between an anode of the battery and the ground by each insulation resistance measurement mode; determining, which of the respective measurement ranges corresponds to each of the first and second insulation resistance values; and determining an actual insulation resistance value using the respective insulation resistance measurement mode for which the insulation resistance measurement error rate within the determined measurement range is lowest.

Here, when measuring an insulation resistance, changing between ones of the plurality of insulation resistance measurement modes by changing a resistance value of a first resistance unit having a first end connected to the cathode of the battery and a second end connected to the ground, and a resistance value of a second resistance unit having a first end connected to the anode of the battery and a second end connected to the ground.

Advantageous Effects

According to the present invention, when measuring the insulation resistance of the battery, it is possible to prevent the measurement accuracy from being lowered by calculating the insulation resistance in a measurement range within an error range corresponding to the actual insulation resistance value. This allows more accurate insulation resistance values to be measured and reported when the battery system is diagnosed.

Other effects of the present invention will be further described according to the following examples.

BRIEF DESCRIPTION OF THE DRAWINGS

FIG. 8(a) is a table showing a measurement error with respect to the insulation resistance value in the first insulation resistance measurement mode and FIG. 8(b) is a table showing measurement error with respect to the insulation resistance value in the second insulation resistance measurement mode.

DETAILED DESCRIPTION

Figure 1:
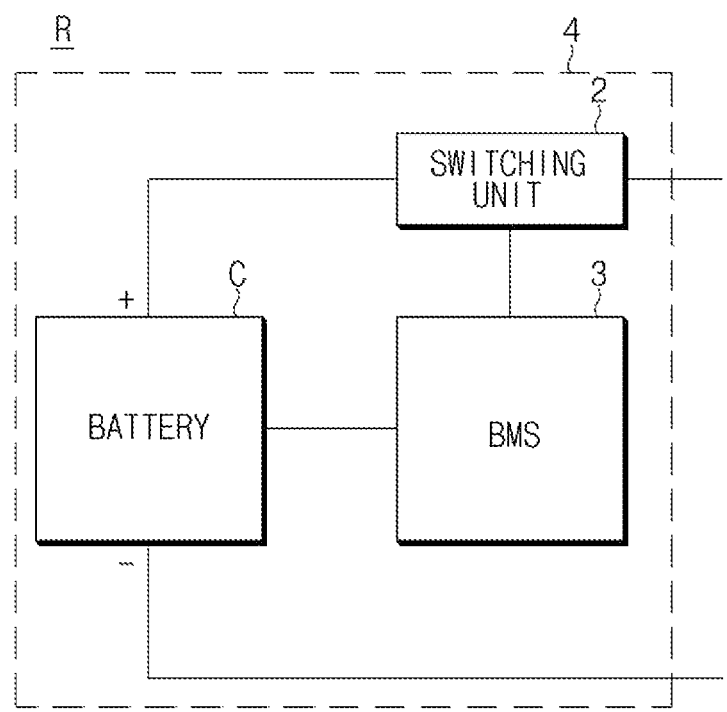
FIG. 1 is a block diagram showing the configuration of a battery rack.

Hereinafter, some embodiments of the present invention will be described in detail through exemplary drawings. It should be noted that, in assigning reference numerals to components of each drawing, although the components are displayed on different drawings, like reference numerals refer to like components. Additionally, in describing the inventive concept, detailed descriptions of well-known configurations or functions will be omitted if it is determined that they would obscure the subject matter of the inventive concept.

First, the configuration of the battery rack will be briefly described with reference to FIG. 1. FIG. 1 is a block diagram showing the configuration of a battery rack.

As shown in FIG. 1, for example, a battery rack R that can be applied to a high voltage battery system includes a battery C capable of charging and discharging in which one or more battery modules (e.g., battery packs) are connected in series or in parallel, a switching unit 2 connected in series to the +terminal (anode) side or the –terminal (cathode) side of the battery C to control the charge/discharge current flow of the battery C, and a battery management system 3 (hereinafter also referred to as BMS) that monitors the voltage, current, temperature, etc. of the battery and controls and manages it to prevent overcharge and overdischarge.

Here, the switching unit 2 is a switching element for controlling the current flow for the charging or discharging of the battery C, and may be a configuration that is essentially provided for the operation of the battery rack R.

In addition, the BMS 3 can monitor voltage, current, temperature, and the like as the state of the battery C. The BMS 3 may include a circuit that receives a value obtained by measuring various parameters such as voltage, current, and temperature, and performs a process of the received value.

In addition, such a configuration of the battery rack R is provided in the chassis 4 as a housing, and the chassis 4 is grounded. Each of the components of the battery rack R, that is, the battery C, the switching unit 2, the BMS 3, and the chassis 4, is designed to be insulated therebetween, so that an insulation resistance exists between the battery and the chassis.

Since the configuration of the battery rack R and the BMS 3 is a known configuration, more detailed description thereof will be omitted.

Figure 2:
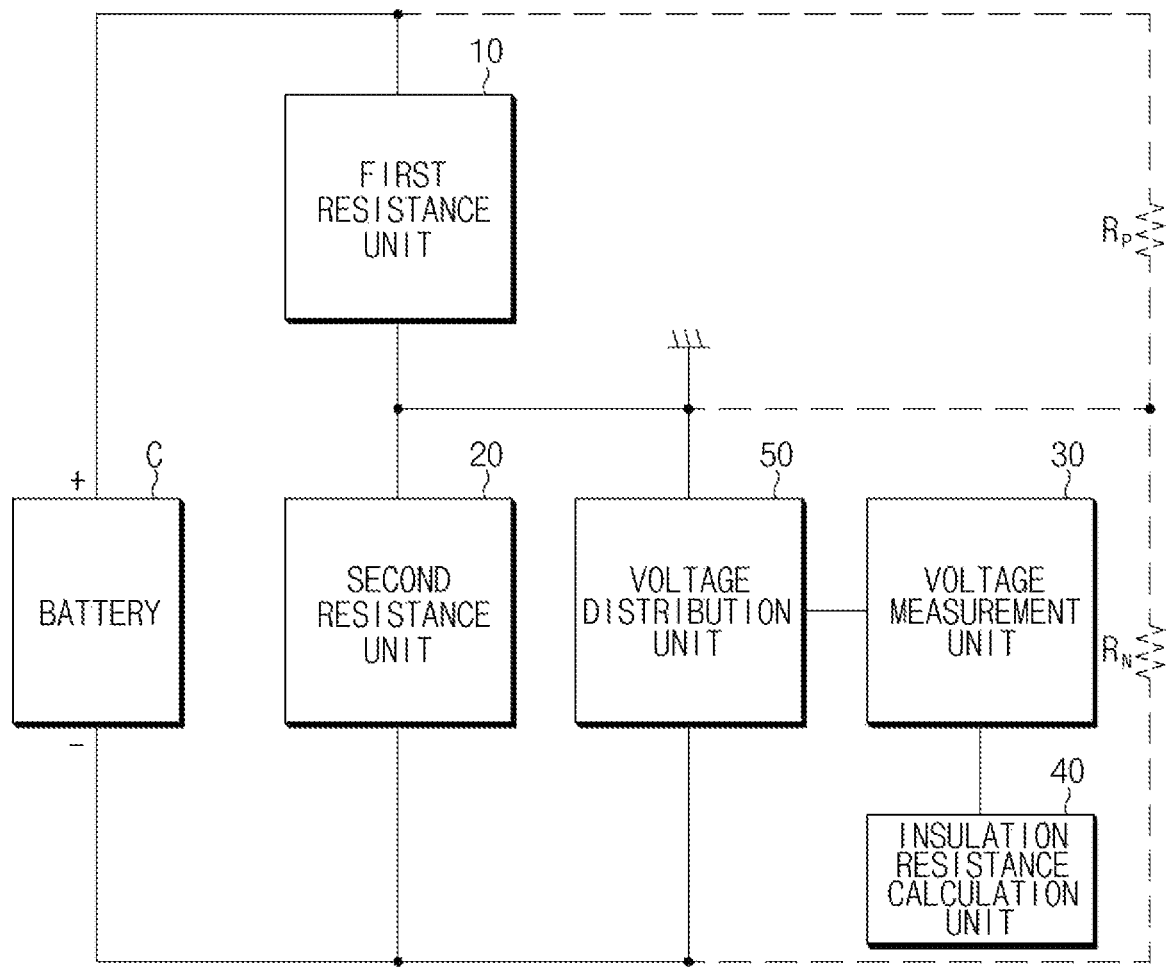
FIG. 2 is a block diagram showing the configuration of an insulation resistance measurement apparatus according to an embodiment of the present invention.
Figure 3:
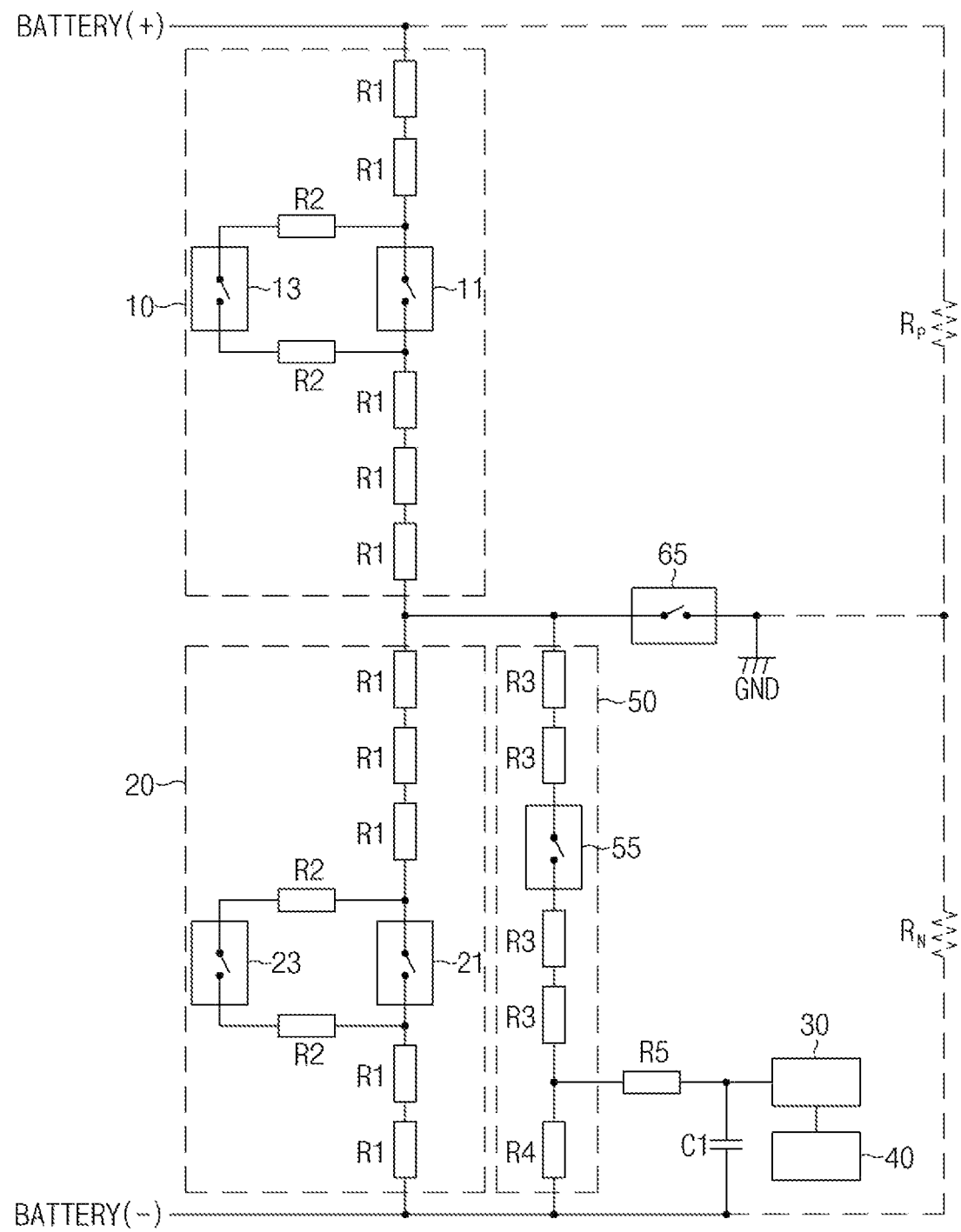
FIG. 3 is a diagram schematically illustrating a circuit configuration of an insulation resistance measurement apparatus according to an embodiment of the present invention.
Figure 4:
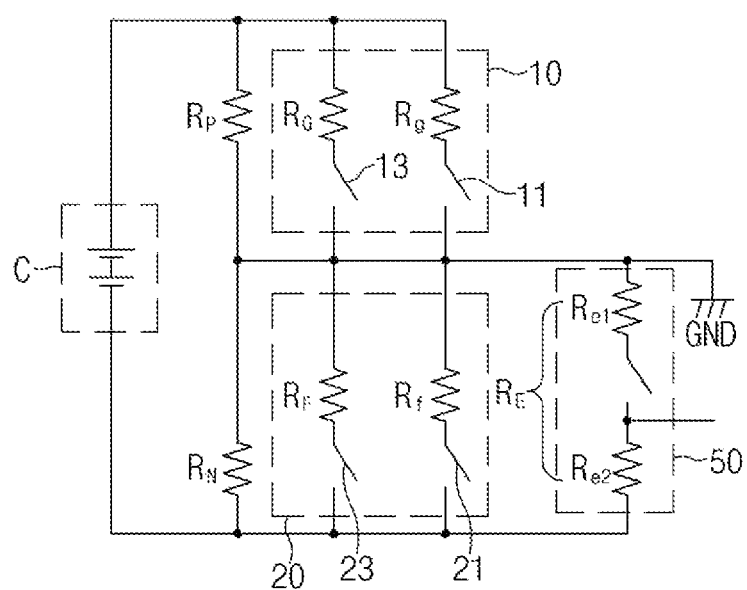
FIG. 4 is an equivalent circuit of FIG. 3.

Next, an insulation resistance measurement apparatus according to an embodiment of the present invention will be described with reference to FIGS. 2 to 4. FIG. 2 is a block diagram showing a configuration of an insulation resistance measurement apparatus according to an embodiment of the present invention. FIG. 3 is a diagram schematically illustrating a circuit configuration of an insulation resistance measurement apparatus according to an embodiment of the present invention. FIG. 4 is an equivalent circuit of FIG. 3.

As shown in FIG. 2, the insulation resistance measurement apparatus according to an embodiment of the present invention may include a first resistance unit 10, a second resistance unit 20, a voltage measurement unit 30, and an insulation resistance calculation unit 40.

The first resistance unit 10 has a configuration in which one end is connected to the cathode of the battery C and the other end is connected to the ground, and may optionally have a first resistance value or a second resistance value greater than the first resistance value under control.

For example, as shown in FIG. 3, the first resistance unit 10 may have a circuit configuration in which the first resistance value unit that is ON/OFF controlled by the first switch 11 and the second resistance value unit that is ON/OFF controlled by the second switch 13 are connected in parallel between the cathode of the battery C and the ground. For example, the first switch 11 and the second switch 13 may be controlled by an insulation resistance calculation unit 40. As such, the first resistance unit 10 may have a first resistance value or a second resistance value selectively by ON/OFF control of the first switch 11 and the second switch 13.

Here, the first resistance value unit may be a resistance unit having a first resistance value, and may include, for example, a plurality of resistors (five R1s) connected in series and a first switch 11. In the same manner, the second resistance value unit may be a resistance unit having a second resistance value, and may include, for example, a plurality of resistors (five R1s and two R2s) connected in series and a second switch 13. The first resistance value and the second resistance value are values set assuming that the actual insulation resistance value is high or low. Although FIG. 3 illustrates that the first resistance value unit and the second resistance value unit share a plurality of resistors (five R1s), as long as the first resistance value unit and the second resistance value unit have the first resistance value and the second resistance value, respectively, they may not be shared and may be designed with different resistors. In addition, although the first resistance value unit and the second resistance value unit are shown to be formed of a plurality of resistors, the resistors may be designed as one or more resistors as long as they have a set resistance value.

For example, when the first switch 11 or the second switch 13 of the first resistance unit 10 is controlled to be ON, the third switch 21 and the fourth switch 23 of the second resistance unit 20 are controlled to be OFF.

In addition, in the second resistance unit 20, one end is connected to the anode of the battery C and the other end is connected to the ground, and it may optionally have a third resistance value or a fourth resistance value greater than the third resistance value.

For example, as shown in FIG. 3, the second resistor unit 20 may have a circuit configuration in which the third resistance value unit that is ON/OFF controlled by the third switch 21 and the fourth resistance value unit that is ON/OFF controlled by the fourth switch 23 are connected in parallel between the anode of the battery C and the ground. For example, the third switch 21 and the fourth switch 23 may be controlled by the insulation resistance calculation unit 40. As such, the second resistance unit 20 may have a third resistance value or a fourth resistance value selectively by ON/OFF control of the third switch 21 and the fourth switch 23.

Here, the third resistance value unit may be a resistance unit having a third resistance value, and may include, for example, a plurality of resistors (five R1s) connected in series and a third switch 21. In the same manner, the fourth resistance value unit may be a resistance unit having a fourth resistance value, and may include, for example, a plurality of resistors (five R1s and two R2s) connected in series and a fourth switch 23. The third resistance value and the fourth resistance value are values set assuming that the actual insulation resistance value is high or low and may be the same as the first resistance value and the second resistance value, respectively. Although FIG. 3 illustrates that the third resistance value unit and the fourth resistance value unit share a plurality of resistors (five R1s), as long as the third resistance value unit and the fourth resistance value unit have the third resistance value and the fourth resistance value, respectively, they may not be shared and may be designed with different resistors. In addition, although the third resistance value unit and the fourth resistance value unit are shown to be formed of a plurality of resistors, the resistors may be designed as one or more resistors as long as they have a set resistance value.

For example, when the third switch 21 or the fourth switch 23 of the second resistance unit 20 is controlled to be ON, the first switch 11 and the second switch 13 of the first resistance unit 10 are controlled to be OFF.

Here, the first resistance value to the fourth resistance value may be changed according to the battery C or a device in which the battery C is mounted.

As an embodiment, the battery C may be a battery rack, and the ground may be a chassis of the battery rack.

The voltage measurement unit 30 is a configuration for measuring the voltage of each part of the circuit, and may measure voltages related to both ends of the first resistance unit 10 or the second resistance unit 20. In particular, in order to measure the insulation resistance of the battery, for example, the voltage can be measured from some resistance of the voltage distribution unit 50 described later.

In addition, the insulation resistance calculation unit 40 is configured to calculate the insulation resistance of the battery using the first to fourth resistance values and the voltage measured by the voltage measurement unit 30, and for example, may calculate a first insulation resistance value between the cathode of the battery C and the ground and a second insulation resistance value between the anode of the battery C and the ground. In one example, the insulation resistance calculation unit 40 may be implemented as, for example, a microcontroller unit (MCU).

The voltage distribution unit 50 is configured to distribute the voltage at a predetermined voltage distribution ratio during insulation resistance measurement, and for example, as in FIG. 3, may be connected in parallel with the second resistance unit 20 and may be composed of a plurality of resistors (four R3s and one R4) connected in series. At this time, the voltage measurement unit 30 may measure the voltage from both ends of the resistor R4. Furthermore, the voltage distribution ratio is determined by the resistance ratio between the plurality of resistors connected in series, and is set for easy voltage measurement.

In addition, the voltage distribution unit 50 is connected in parallel with the second resistance unit 20 in FIG. 3, but may be designed to be connected in parallel with the first resistance unit 10. In addition, as shown in FIG. 3, in order to be separated from the circuit, the voltage distribution unit 50 may further include a fifth switch 55 connected in series with a plurality of resistors (four R3s and one R4) to be ON/OFF controlled. Also, as in FIG. 3, a resistor R5 and a capacitor C1 for circuit protection, such as noise removal, may be further provided between the voltage distribution unit 50 and the insulation resistance calculation unit and in addition, a switch 65 may be further provided between the first resistance unit 10 and the second resistance unit 20 and the ground.

For example, the circuit configuration of the insulation resistance measurement apparatus in FIG. 3 may be represented by an equivalent circuit as shown in FIG. 4. That is, in the first resistance unit 10, the first resistance value may be represented by Rg and the second resistance value may be represented by RG, and in the second resistance unit 20, the third resistance value may be represented by Rf and the fourth resistance value may be represented by RF. In addition, the plurality of resistors of the voltage distribution unit 50 may be represented by Re1 and Re2, and the sum of the plurality of resistors may be represented by RE.

Accordingly, the insulation resistance calculation unit 40 may calculate the first insulation resistance value RP between the cathode of the battery C and the ground and the second insulation resistance value RN between the anode of the battery C and the ground using the voltage measured by the voltage measurement unit 30 from some resistors Re2 of the voltage distribution unit 50.

For example, the insulation resistance calculation unit 40 is provided with a plurality of insulation resistance measurement modes having a relatively low error rate in different measurement ranges, for example, a first insulation resistance measurement mode and a second insulation resistance measurement mode so that the insulation resistance calculation unit 40 calculates first and second insulation resistance values RP and RN using the first resistance value Rg and the third resistance value Rf in the first insulation resistance measurement mode, and calculates the first and second insulation resistance values RP and RN using the second resistance value RG and the fourth resistance value RF in the second insulation resistance measurement mode.

Specifically, in the case of the first insulation resistance measurement mode, by using the voltage measured from some resistors Re2 of the voltage distribution unit 50 when the first switch 11 is controlled to be ON and the second to fourth switches 13, 21, and 23 are controlled to be OFF and the voltage measured from some resistors Re2 of the voltage distribution unit 50 when the third switch 21 is controlled to be ON and the first, second, and fourth switches 11, 13, and 23 are controlled to be OFF, the first and second insulation resistance values RP and RN may be calculated.

In a similar way, in the case of the second insulation resistance measurement mode, by using the voltage measured from some resistors Re2 of the voltage distribution unit 50 when the second switch 13 is controlled to be ON and the first, third, and fourth switches 11, 21, and 23 are controlled to be OFF and the voltage measured from some resistors Re2 of the voltage distribution unit 50 when the fourth switch 23 is controlled to be ON and the first to third switches 11, 13, and 21 are controlled to be OFF, the first and second insulation resistance values RP and RN may be calculated.

As such, the insulation resistance calculation unit 40 may calculate first and second insulation resistance values in the plurality of insulation resistance measurement modes, respectively.

Here, when measuring insulation resistance, a plurality of insulation resistance measurement modes are modes that are changed by changing a resistance value of the first resistance unit 10 having one end connected to the cathode of the battery and the other end connected to the ground and a resistance value of the second resistance unit 20 having one end connected to the anode of the battery and the other end connected to the ground, and for example, the measurement range of the first insulation resistance measurement mode has a relatively low error rate when the actual insulation resistance is low and the measurement range of the second insulation resistance measurement mode has a relatively low error rate when the actual insulation resistance is high.

In addition, the insulation resistance calculation unit 40 determines one insulation resistance value among the calculated insulation resistance values as the actual insulation resistance value.

For example, for each of the first and second insulation resistance values, a measurement range is determined corresponding to the insulation resistance value calculated in the first insulation resistance measurement mode and the insulation resistance value calculated in the second insulation resistance measurement mode, and the insulation resistance value calculated in the measurement mode having a relatively low error rate in the measurement range determined among the first insulation resistance measurement mode and the second insulation resistance measurement mode is determined as the actual insulation resistance value.

In one example, the insulation resistance measurement apparatus according to an embodiment of the present invention may be implemented as a portion of functions of the battery management system of the battery rack, or may be implemented as a separate device.

According to the present invention as described above, when measuring the insulation resistance of the battery, by calculating the insulation resistance in the measurement range within the error range corresponding to the actual insulation resistance value, that is, the measurement range having a relatively low error rate, it is possible to prevent the measurement accuracy from being lowered. This allows more accurate insulation resistance values to be measured and reported when the battery system is diagnosed.

Figure 5:
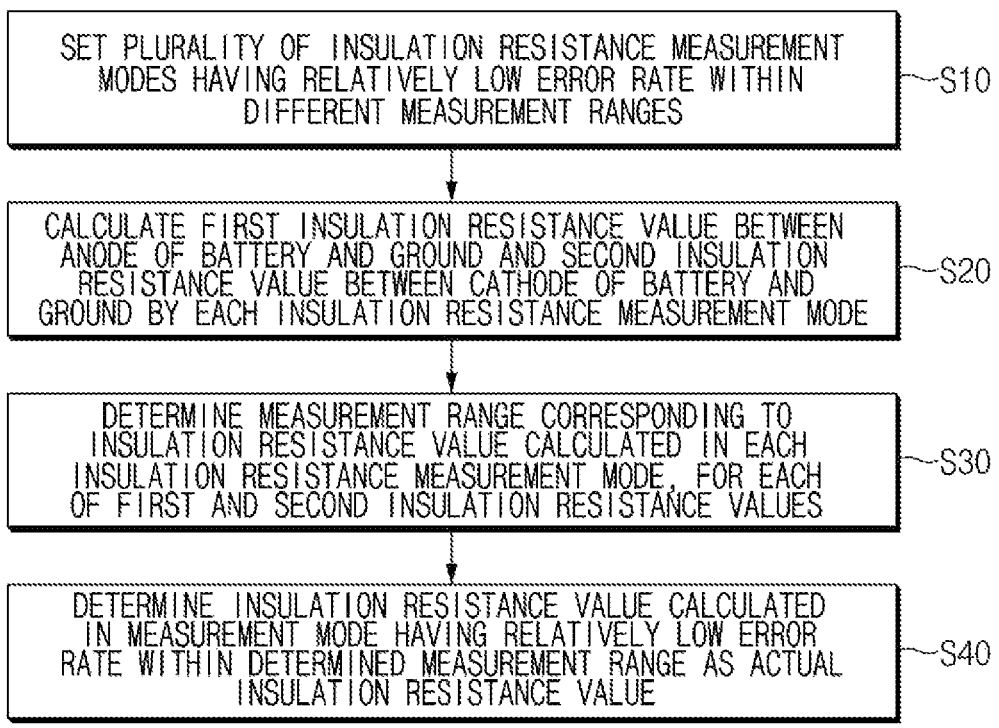
FIG. 5 is a flowchart showing an insulation resistance measurement method according to an embodiment of the present invention.
Figure 6:
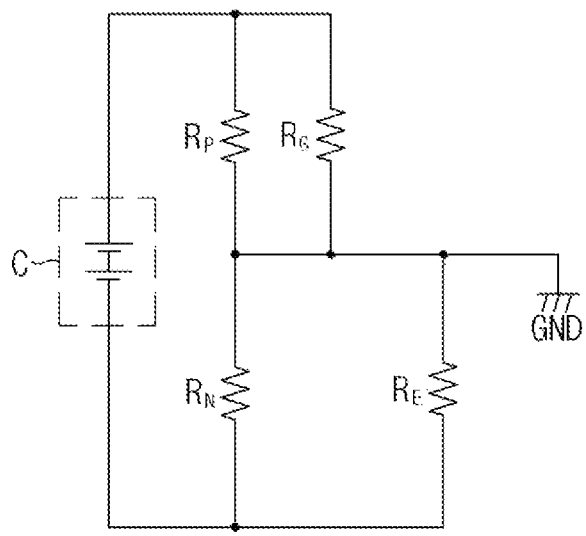
FIGS. 6(a) and 6(b) are diagrams for explaining a method of calculating insulation resistance values in a second insulation resistance measurement mode according to an embodiment of the present invention.
Figure 6:
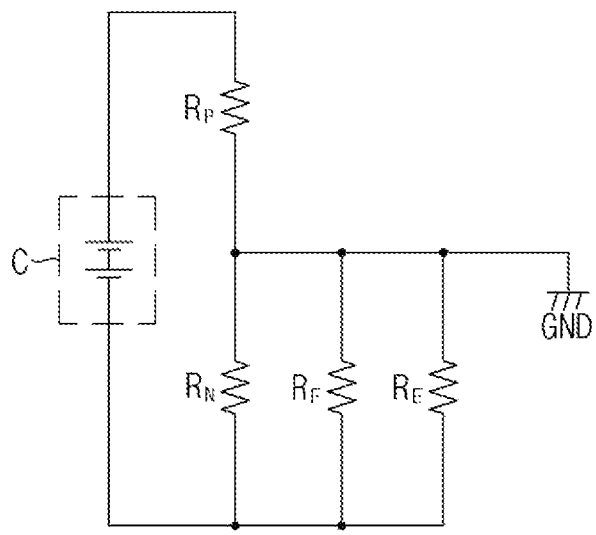
Figure 7:
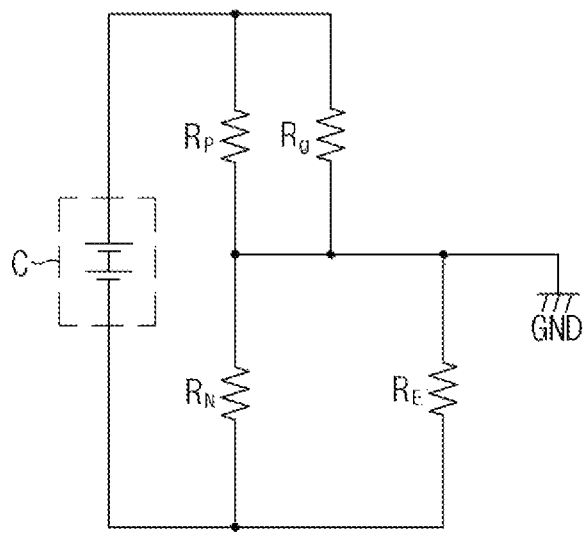
FIGS. 7(a) and 7(b) are diagrams for explaining a method of calculating insulation resistance values in a first insulation resistance measurement mode according to an embodiment of the present invention.
Figure 7:
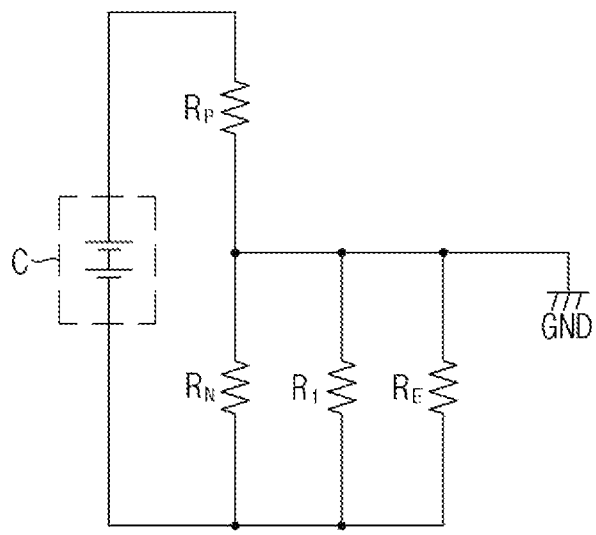

Next, the insulation resistance measurement method according to an embodiment of the present invention will be described with reference to FIGS. 5 to 7. FIG. 5 is a flowchart showing an insulation resistance measurement method according to an embodiment of the present invention. FIGS. 6(a) and 6(b) are diagrams for explaining a method of calculating insulation resistance values in a second insulation resistance measurement mode according to an embodiment of the present invention. FIGS. 7(a) and 7(b) are diagrams for explaining a method of calculating insulation resistance values in a first insulation resistance measurement mode according to an embodiment of the present invention.

As shown in FIG. 5, first, in order to measure the insulation resistance of the battery C, the insulation resistance measurement method according to an embodiment of the present invention sets a plurality of insulation resistance measurement modes having a relatively low error rate in different measurement ranges (S10).

As described above, when measuring insulation resistance, the plurality of insulation resistance measurement modes are modes changed by changing a resistance value of the first resistance unit 10 having one end connected to the cathode of the battery C and the other end connected to the ground and a resistance value of the second resistance unit 20 having one end connected to the anode of the battery C and the other end connected to ground.

For example, the plurality of insulation resistance measurement modes may include a first insulation resistance measurement mode having a relatively low error rate as a measurement range when the actual insulation resistance has a low value and a second insulation resistance measurement mode having a relatively low error rate as a measurement range when the actual insulation resistance has a high value.

Next, a first insulation resistance value RP between the cathode of the battery C and the ground and a second insulation resistance value RN between the anode of the battery C and the ground are calculated by respective insulation resistance measurement modes (S20).

For example, as the second insulation resistance measurement mode, as shown in FIG. 6(a), when the first resistance unit 10 has a second resistance value RG, that is, when the second switch 13 is controlled to be ON and the first, third, and fourth switches 11, 21, and 23 are controlled to be OFF, Equation 1 for the measured voltage A can be derived from the equivalent circuit.

$$\frac{(R_N // R_E)}{(R_N // R_E) + (R_P // R_G)} \cdot C \cdot D = A \qquad \text{[Equation 1]}$$

Here, RN is a second insulation resistance value, RE is the sum of the resistance values of the voltage distribution unit, RP is the first insulation resistance value, C is the voltage value of the battery, and D is the voltage distribution ratio for measuring of the voltage distribution unit. Here, the measured voltage A is, for example, the voltage measured from the resistor Re2 of the voltage distribution unit.

In addition, as the second insulation resistance measurement mode, as shown in FIG. 6(b), when the second resistance unit 20 has a fourth resistance value RF, that is, when the fourth switch 23 is controlled to be ON and the first to third switches 11, 13, and 21 are controlled to be OFF, Equation 2 for the measured voltage B can be derived from the equivalent circuit.

$$\frac{(R_N // R_E) // R_P}{(R_N // R_E) // R_P + R_P} \cdot C \cdot D = B \qquad \text{[Equation 2]}$$

In this case, when (RN//RE) is X, Equation 1 may be expressed as Equation 3 and Equation 2 may be expressed as Equation 4.

$$\frac{X + (R_P // R_G)}{X} = \frac{C \cdot D}{A} \qquad \text{[Equation 3]}$$

$$\frac{(X // R_P) + R_P}{(X // R_P)} = \frac{C \cdot D}{B} \qquad \text{[Equation 4]}$$

Here, if Equation 3 is summarized as X, it can be expressed as Equation 5, and if Equation 4 is summarized as X, it can be expressed as Equation 6.

$$X = \frac{A \cdot R_G \cdot R_P}{(R_P + R_G) \cdot (C \cdot D - A)} \qquad \text{[Equation 5]}$$

$$X = \frac{B \cdot R_P \cdot R_P}{(C \cdot D \cdot R_P) - (B \cdot R_P) - (B \cdot R_P)} \qquad \text{[Equation 6]}$$

Accordingly, by using equations 5 and 6 as simultaneous equations, X can be eliminated to derive the first insulation resistance value RP as shown in Equation 7.

$$R_P = \frac{C \cdot D \cdot R_E \cdot R_G + (A - B)}{A \cdot B \cdot R_P \cdot A \cdot B \cdot R_E + B \cdot C \cdot D \cdot R_P} \qquad \text{[Equation 7]}$$

Subsequently, by substituting X=(RN//RE) into Equation 5, the second insulation resistance value RN can be derived as in Equation 8.

$$R_E = \frac{A \cdot R_E \cdot R_G \cdot R_P}{R_E \cdot (R_P \cdot R_G) \cdot (C \cdot D - A) - A \cdot R_G \cdot R_P} \qquad \text{[Equation 8]}$$

In this manner, the first and second insulation resistance values can be calculated in the second insulation resistance measurement mode.

In the same manner, as the first insulation resistance measurement mode, as shown in FIG. 7(a), when the first resistance unit 10 has the first resistance value Rg, that is, when the first switch 11 is controlled to be ON and the second to fourth switches 13, 21, and 23 are controlled to be OFF, the equation for the measured voltage from the equivalent circuit is derived, and as shown in FIG. 7(b), when the second resistance unit 20 has the third resistance value Rf, that is, when the third switch 21 is controlled to be ON and the first, second, and fourth switches 11, 13, and 23 are controlled to be OFF, the equation for the measured voltage can be derived from the equivalent circuit to calculate the first and second insulation resistance values.

Back to FIG. 5, for each of the calculated first and second insulation resistance values, the measurement range corresponding to the insulation resistance value calculated in each insulation resistance measurement mode is determined (S30).

Subsequently, the insulation resistance value calculated in the measurement mode having a relatively low error rate in the determined measurement range is determined as the actual insulation resistance value (S40).

The measurement error in each insulation resistance measurement mode can be obtained by repeated experiments, as shown in FIG. 8.

For example, FIG. 8(a) is a table showing a measurement error (%) with respect to the insulation resistance value in the first insulation resistance measurement mode and FIG. 8(b) is a table showing measurement error (%) with respect to the insulation resistance value in the second insulation resistance measurement mode.

As shown in FIG. 8(a), it can be seen that in the first insulation resistance measurement mode, an error of a relatively small insulation resistance value is lower than an error of a relatively large insulation resistance value. Accordingly, the measurement range of the first insulation resistance measurement mode may be set to a range having a relatively low error rate, for example, a range of 10,000 k ohms or less.

In addition, as shown in FIG. 8(b), it can be seen that in the second insulation resistance measurement mode, an error of a relatively large insulation resistance value is lower than an error of a relatively small insulation resistance value. Accordingly, the measurement range of the second insulation resistance measurement mode may be set to a range having a relatively low error rate, for example, a range of 10,000 k ohms or more.

For example, when the first or second insulation resistance values calculated in the first and second insulation resistance measurement modes are all 10,000 k ohms or less, it may be determined that the corresponding measurement range corresponds to the measurement range of the relatively low first insulation resistance measurement mode in operation S30 of FIG. 5, and the insulation resistance value calculated in the first insulation resistance measurement mode may be determined as the actual insulation resistance value in operation S40 of FIG. 5.

Accordingly, in order to accurately measure a relatively low insulation resistance value, the first insulation resistance measurement mode is used and in order to accurately measure a relatively high insulation resistance value, the second insulation resistance measurement mode is used.

When measuring the insulation resistance of the battery C in such a manner, by calculating the insulation resistance within the measurement range corresponding to the actual insulation resistance value, it is possible to prevent the measurement accuracy from being lowered.

Figure 9:
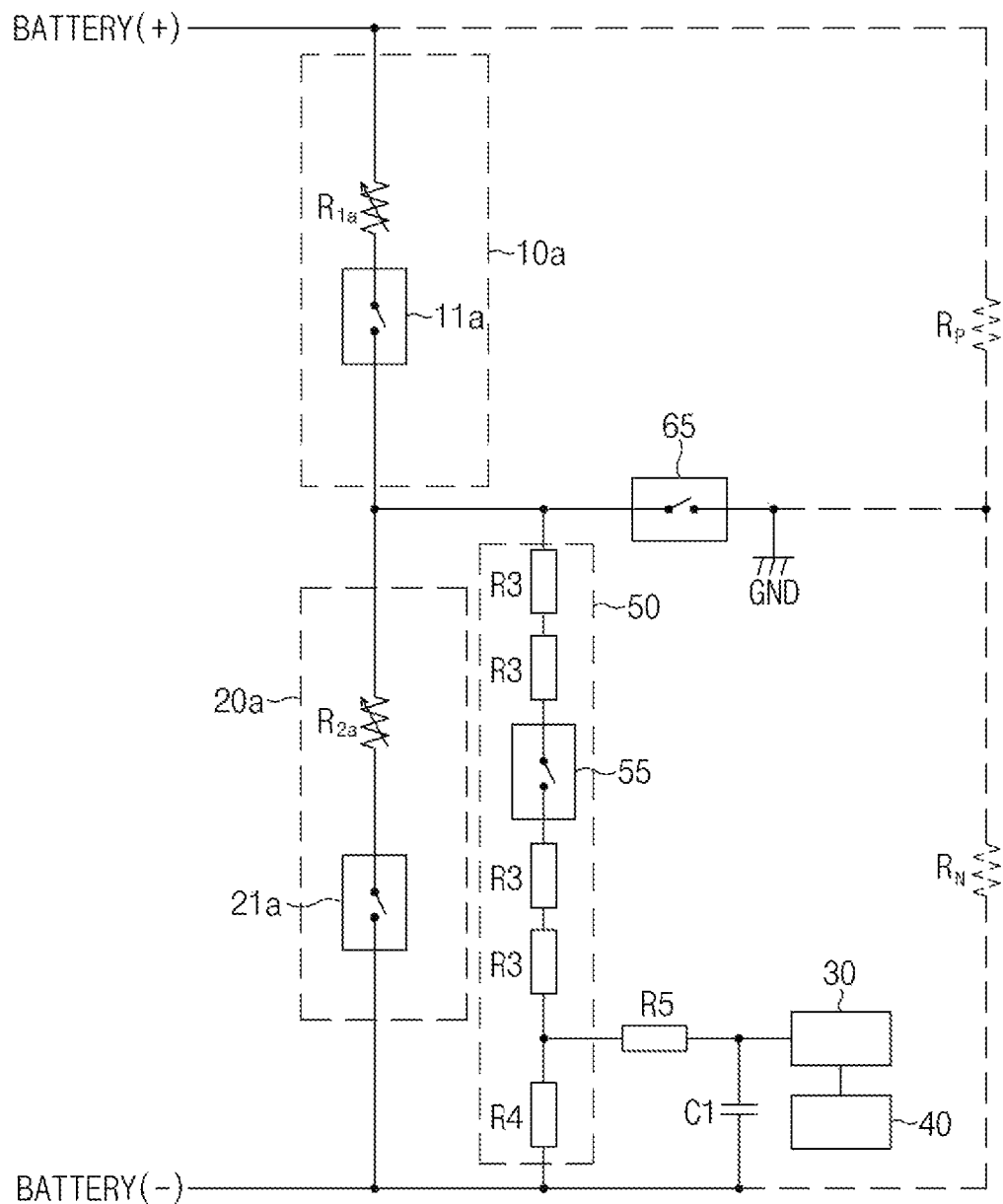
FIG. 9 is a diagram schematically illustrating a circuit configuration of an insulation resistance measurement apparatus according to another embodiment of the present invention.

On the other hand, it is described in the above description that the first resistance unit 10 and the second resistance unit 20 of the insulation resistance measurement apparatus have a parallel circuit structure using a plurality of switches and a plurality of resistors in order to have a plurality of resistance values as shown in FIG. 3 but for example, as shown in FIG. 9, they may be designed using a variable resistor.

FIG. 9 is a diagram schematically illustrating a circuit configuration of an insulation resistance measurement apparatus according to another embodiment of the present invention.

As shown in FIG. 9, in an insulation resistance measurement apparatus according to another embodiment of the present invention, the first resistance unit 10a may include a first variable resistance unit R1a that is ON/OFF controlled by the first switch 11 and can be converted into a first resistance value or a second resistance value between the cathode of battery C and the ground, and in the same manner, the second resistance unit 20a may include a second variable resistance unit R2a that is ON/OFF controlled by the third switch 21a and can be converted into a third resistance value or a fourth resistance value between the anode of the battery C and the ground. Other configurations are as described above.

Figure 10:
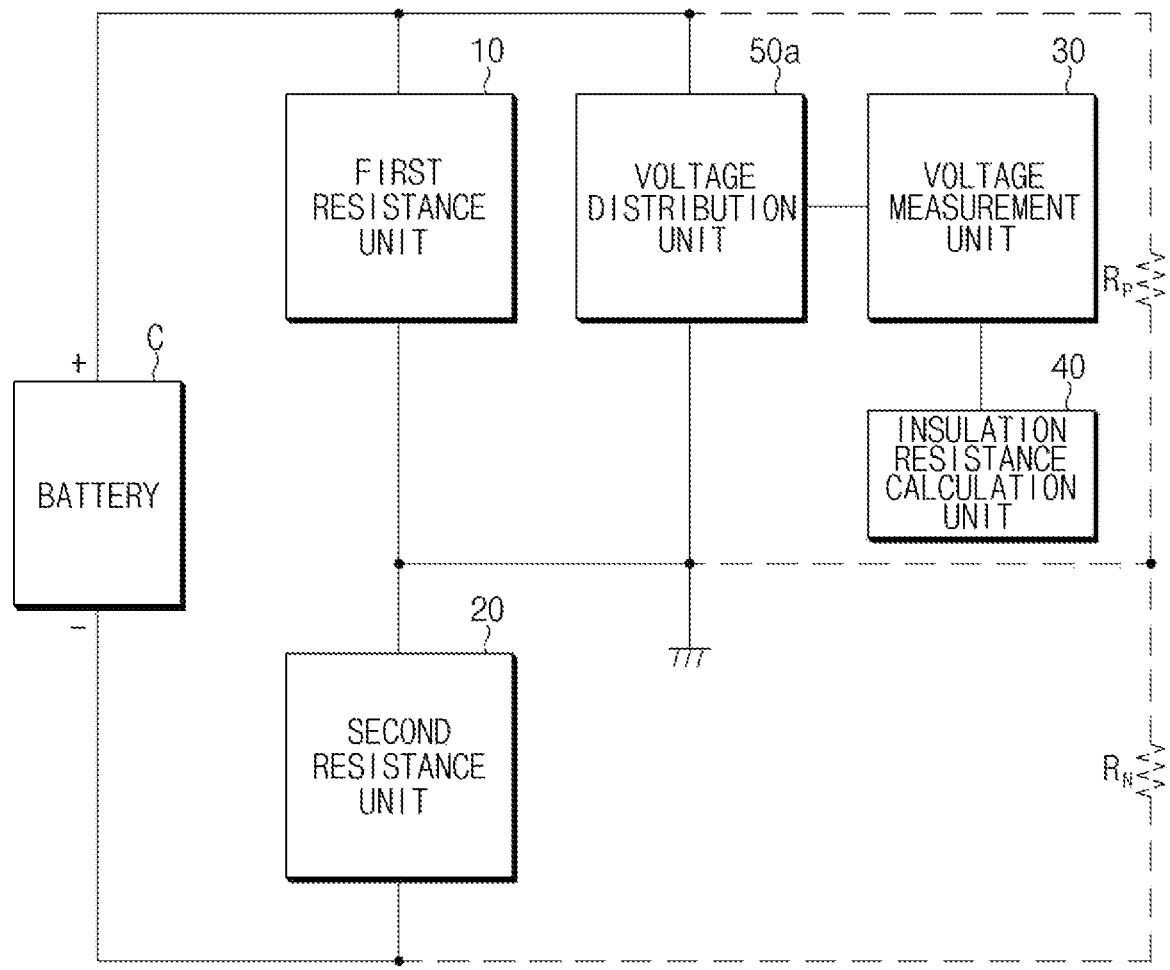
FIG. 10 is a block diagram showing the configuration of an insulation resistance measurement apparatus according to another embodiment of the present invention.

In the above description, the voltage distribution unit 50 of the insulation resistance measurement apparatus is connected in parallel with the second resistance unit 20, as shown in FIG. 2, but for example, as shown in FIG. 10, may be designed to be connected in parallel with the first resistance unit 10.

FIG. 10 is a block diagram showing the configuration of an insulation resistance measurement apparatus according to another embodiment of the present invention.

As shown in FIG. 10, the voltage distribution unit 50a may be designed to have a parallel structure with the first resistance unit 10 between the cathode of the battery C and the ground. Other configurations are as described above.

As another embodiment, the insulation resistance measurement method according to an embodiment of the present invention described above may be implemented as a program stored in a recording medium for performing each operation, and the corresponding program is stored in the memory of the BMS of the battery rack and can be executed by the MCU. In other words, the method of the present invention can be written in a computer program. And, the code and code segments constituting the program can be easily inferred by computer programmers in the art. Further, the created program is stored in a computer-readable recording medium (information storage medium), and can be read and executed by a computer to realize the method of the present invention. Then, the recording medium may include any type of computer-readable recording medium. The recording medium may be provided separately from the MCU, or may be configured integrally with the MCU.

Figure 11:
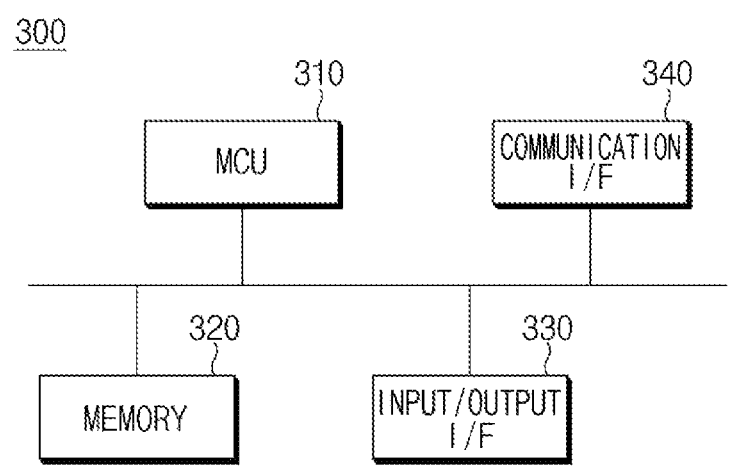
FIG. 11 is a block diagram illustrating a hardware configuration of a battery management system according to an embodiment of the present invention.

For example, the BMS of the battery rack of the present invention may be implemented as shown in FIG. 11. FIG. 11 is a block diagram illustrating a hardware configuration of a battery management system (BMS) according to an embodiment of the present invention.

As shown in FIG. 11, the battery management system 300 may include an MCU 310 for controlling various processing and each configuration, a memory 320 for recording an operating system program and various programs (for example, an insulation resistance measurement program of a battery), an input/output interface 330 providing an input interface and an output interface between the battery and/or the switching unit, and a communication interface 340 capable of communicating with the outside through a wired or wireless communication network. As described above, the computer program according to the present invention may be recorded in the memory 320 and processed by the microcontroller 310 to be implemented as a module for performing the respective functional blocks shown in FIG. 2.

Although the present invention has been described above by limited embodiments and drawings, the present invention is not limited thereto, and it will be apparent to those skilled in the art that the present invention may be implemented in various ways within the equivalent scope of the technical spirit of the present invention and the claims to be described below.

The invention claimed is:

1. An insulation resistance measurement apparatus comprising:
 a first resistance unit having a first end connected to a positive side of a battery and a second end connected to a ground, wherein the first resistance unit is variably controllable between having a first resistance value or a second resistance value greater than the first resistance value;
 a second resistance unit having a first end connected to a negative side of the battery and a second end connected to the ground, wherein the second resistance unit is variably controllable between having a third resistance value or a fourth resistance value greater than the third resistance value;
 a voltage measurement unit configured to measure a voltage across the first resistance unit and a voltage across the second resistance unit; and
 an insulation resistance calculation unit configured to calculate a first insulation resistance value between the positive side of the battery and the ground and a second insulation resistance value between the negative side of the battery and the ground based on the first resistance value, the second resistance value, the third resistance value, the fourth resistance value and the voltage measured by the voltage measurement unit wherein the insulation resistance calculation unit has a first insulation resistance measurement mode and a second insulation resistance measurement mode, wherein the first insulation resistance measurement mode has a lower error rate than the second insulation resistance measurement mode in a first measurement range, and wherein the second insulation resistance measurement mode has a lower error rate than the first insulation resistance measurement mode in a second measurement range.

2. The insulation resistance measurement apparatus of claim 1, further comprising a voltage distribution unit connected in parallel with the first resistance unit or the second resistance unit, wherein the voltage distribution unit includes a plurality of resistors connected in series,
 wherein the voltage measured by the voltage measurement unit is a voltage measured across some of the plurality of resistors of the voltage distribution unit.

3. The insulation resistance measurement apparatus of claim 2, wherein the insulation resistance calculation unit is configured to:
 calculate the first and second insulation resistance values based on the first resistance value and the third resistance value in the first insulation resistance measurement mode, and
 calculate the first and second insulation resistance values based on the second resistance value and the fourth resistance value in the second insulation resistance measurement mode.

4. The insulation resistance measurement apparatus of claim 3, wherein, for the first insulation resistance value, the insulation resistance calculation unit is configured to:
 determine whether the first insulation resistance value is within the first or second measurement range; and
 calculate a first actual insulation resistance value in whichever measurement mode has the lower error rate in the determined first or second measurement range that the first insulation resistance value is within, and for the second insulation resistance value, the insulation resistance calculation unit is configured to:
 determine whether the second insulation resistance value is within the first or second measurement range; and
 calculate a second actual insulation resistance value in whichever measurement mode has the lower error rate in the determined first or second measurement range that the second insulation resistance value is within.

5. The insulation resistance measurement apparatus of claim 3, wherein the first resistance unit includes a first resistance value unit that is ON/OFF controlled by a first switch and a second resistance value unit that is ON/OFF controlled by a second switch, wherein the first and second resistance value units are connected in parallel between the positive side of the battery and the ground,
 wherein the second resistance unit includes a third resistance value unit that is ON/OFF controlled by a third switch and a fourth resistance value unit that is ON/OFF controlled by a fourth switch, wherein the third and fourth resistance value units are connected in parallel between the negative side of the battery and the ground.

6. The insulation resistance measurement apparatus of claim 5, when the first switch or the second switch of the first resistance unit is ON, the insulation resistance calculation unit controls the third switch and the fourth switch of the second resistance unit to be OFF.

7. The insulation resistance measurement apparatus of claim 5, when the third switch or the fourth switch of the second resistance unit is ON, the insulation resistance calculation unit controls the first switch and the second switch of the first resistance unit to be OFF.

8. The insulation resistance measurement apparatus of claim 5, wherein, in the first insulation resistance measurement mode, the insulation resistance calculation unit is configured to calculate the first and second insulation resistance values based on the voltage measured across some of the plurality resistors of the voltage distribution unit when the first switch is ON and the second, third and fourth switches are OFF and the voltage measured across some of the plurality of resistors of the voltage distribution unit when the third switch is ON and the first, second and fourth switches are OFF.

9. The insulation resistance measurement apparatus of claim 5, wherein in the second insulation resistance measurement mode, the insulation resistance calculation unit is configured to calculate the first and second insulation resistance values based on the voltage measured across some of the plurality of resistors of the voltage distribution unit when the second switch is ON and the first, third, and fourth switches are OFF and the voltage measured across some of the plurality of resistors of the voltage distribution unit when the fourth switch is ON and the first, second and third switches are OFF.

10. The insulation resistance measurement apparatus of claim 1, wherein the first, second, third and fourth resistance values vary according to the battery or according to a device in which the battery is mounted.

11. The insulation resistance measurement apparatus of claim 2, wherein the voltage distribution unit further comprises a switch connected in series with the plurality of resistors, and wherein the switch is configured to be ON/OFF controlled.

12. The insulation resistance measurement apparatus of claim 1, wherein the battery is a battery rack, and wherein the ground is a chassis of the battery rack.

13. The insulation resistance measurement apparatus of claim 3, wherein the first resistance unit includes a first variable resistance unit that is changeable between the first resistance value and the second resistance value based on ON/OFF control by a first switch, wherein the first variable resistance unit is between the positive side of the battery and the ground, and wherein the second resistance unit includes a second variable resistance unit that is changeable between the third resistance value and the fourth resistance value based on ON/OFF control by a second switch, wherein the second variable resistance unit is between the negative side of the battery and the ground.

14. An insulation resistance measurement method comprising:

calculating, by a controller, a first insulation resistance value of a first resistance unit having a first variable resistance and positioned between a positive side of a battery and a ground and a second insulation resistance value of a second resistance unit having a second variable resistance and positioned between a negative side of the battery and the ground in each of a first insulation resistance measurement mode and a second insulation resistance measurement mode, wherein the first insulation resistance measurement mode has a lower error rate than the second insulation resistance measurement mode in a first measurement range, and wherein the second insulation resistance measurement mode has a lower error rate than the first insulation resistance measurement mode in a second measurement range;

determining, by the controller, which of the respective measurement ranges corresponds to each of the first and second insulation resistance values; and determining, by the controller, an actual insulation resistance value using the respective insulation resistance measurement mode for which the insulation resistance measurement error rate within the determined measurement range is lowest.

15. The insulation resistance measurement method of claim 14, further comprising changing between the first insulation resistance measurement mode and the second insulation resistance measurement mode by changing a resistance value of a first resistance unit having a first end connected to the positive side of the battery and a second end connected to the ground, and a resistance value of a second resistance unit having a first end connected to the negative side of the battery and a second end connected to the ground.

* * * * *